(12) United States Patent
Heng et al.

(10) Patent No.: US 8,423,941 B2
(45) Date of Patent: Apr. 16, 2013

(54) STRUCTURAL MIGRATION OF INTEGRATED CIRCUIT LAYOUT

(75) Inventors: Fook-Luen Heng, Yorktown Heights, NY (US); Rajiv V. Joshi, Yorktown Heights, NY (US); Alexey Y. Lvov, Congers, NY (US); Xiaoping Tang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/205,186

(22) Filed: Aug. 8, 2011

(65) Prior Publication Data

US 2013/0042217 A1    Feb. 14, 2013

(51) Int. Cl.
  *G06F 17/50*    (2006.01)

(52) U.S. Cl.
  USPC .......................................... 716/118; 716/119

(58) Field of Classification Search .................. 716/118, 716/119
  See application file for complete search history.

(56) References Cited

U.S. PATENT DOCUMENTS

| | | | |
|---|---|---|---|
| 6,002,857 A * | 12/1999 | Ramachandran ............. | 716/122 |
| 6,189,132 B1 | 2/2001 | Heng et al. | |
| 6,986,109 B2 | 1/2006 | Allen et al. | |
| 6,992,002 B2 | 1/2006 | Dunham et al. | |
| 7,062,729 B2 | 6/2006 | Gray et al. | |
| 7,082,585 B2 | 7/2006 | Gasparik et al. | |
| 7,331,026 B2 | 2/2008 | Sampath | |
| 7,490,308 B2 | 2/2009 | Gonzalez et al. | |
| 7,568,173 B2 | 7/2009 | Gernhoefer et al. | |
| 7,783,995 B2 | 8/2010 | Joshi | |
| 2006/0101356 A1 * | 5/2006 | Allen et al. ........................ | 716/3 |
| 2006/0190889 A1 * | 8/2006 | Cong et al. ........................ | 716/8 |
| 2007/0277129 A1 * | 11/2007 | Allen et al. ........................ | 716/2 |
| 2008/0313581 A1 * | 12/2008 | Gernhoefer et al. ............. | 716/4 |
| 2009/0158223 A1 * | 6/2009 | Gray et al. ........................ | 716/2 |
| 2010/0031218 A1 | 2/2010 | Ramsour et al. | |
| 2010/0185997 A1 * | 7/2010 | Allen et al. ..................... | 716/10 |

OTHER PUBLICATIONS

Heng, Fook-Luen, et al., "A VLSI Artwork Legalization Technique Based on a New Criterion of Minimum Layout Perturbation", Proc. ISPD Apr. 1997, pp. 116-121.

* cited by examiner

*Primary Examiner* — Suresh Memula
(74) *Attorney, Agent, or Firm* — Tutunjian & Bitetto, P.C.; Preston Young

(57) ABSTRACT

Methods and systems for migrating circuit layouts. A floorplan layout is built for a target circuit using a subset of constraints that characterize a layout structure of an original circuit. Shape-constraint-based scaling is used on the floorplan layout by scaling parts of the floorplan layout in accordance with a plurality of different scaling ratios such that portions of the floorplan layout are concurrently scaled with the plurality of different scaling ratios. Cells are placed at locations defined by the floorplan layout. The floorplan layout is checked with shape-constraint-based legalization using all of the constraints to produce a migrated layout.

25 Claims, 7 Drawing Sheets

STRUCTURAL MIGRATION OF INTEGRATED CIRCUIT LAYOUT

BACKGROUND

1. Technical Field

The present invention relates to integrated circuit migration and, more particularly, to methods and systems for migrating an integrated circuit layout from a first fabrication technology to a second fabrication technology.

2. Description of the Related Art

Integrated circuit (IC) layout is usually designed and organized hierarchically. The hierarchical representation of IC layout not only carries the designers' intent and enables a "divide-and-conquer" design principle, but also makes design checking and verification easier. Typically, a modern microprocessor includes a number of separate functional units. Each unit further includes a number of macros. A macro itself may again include a number of levels of design hierarchy with different orientations of cell placement. Array macros (such as static random access memory (SRAM) arrays) belong to a special kind of macros, which are highly structural. For example, an SRAM array contains a stack of SRAM bit cells and the pitch-matching circuits. In an SRAM bit stack, a SRAM bit cell is placed repeatedly. A horizontally pitch-matching circuit is called a "word decoder" and a vertically pitch-matching circuit is called "IO"/"bit decoder." This kind of macro is referred to as "structural layout." Structural layout may not be limited to array macros.

Most often, array macros are in the timing critical path. Therefore, array macros are traditionally custom-designed to achieve density and performance. However, custom design is very time-consuming and resource-consuming. When migrating from one fabrication technology to a newer, more efficient technology, array macros must often be completely redesigned to accommodate the requirements and allowances of the new technology, imposing a high burden on designers.

SUMMARY

A method for migrating circuit layouts according to one exemplary embodiment is shown that includes building a floorplan layout for a target circuit using a subset of constraints that characterize a layout structure of an original circuit, shape-constraint-based scaling the floorplan layout by scaling parts of the floorplan layout in accordance with a plurality of different scaling ratios such that portions of the floorplan layout are concurrently scaled with the plurality of different scaling ratios, placing cells at locations defined by the floorplan layout, and shape-constraint-based legalizing the floorplan layout using all of the constraints to produce a migrated layout.

A system for migrating circuit layouts according to one exemplary embodiment is shown that includes a constraints module configured to establish constraints to characterize a layout structure of an original circuit, a floorplan module configured to build a floorplan layout for a target circuit using a subset of said constraints, a scaling module including a processor configured to perform shape-constraint-based scaling the floorplan layout by scaling parts of the floorplan layout in accordance with a plurality of different scaling ratios such that portions of the floorplan layout are concurrently scaled with the plurality of different scaling ratios, and a legalization module configured to perform shape-constraint-based legalization using all of the constraints and further configured to output a migrated layout.

A method for migrating circuit layout according to one exemplary embodiment is shown that includes building a hierarchical floorplan layout for a target circuit using a subset of constraints that characterize a layout structure of an original circuit, shape-constraint-based scaling the floorplan layout by scaling parts of the floorplan layout in accordance with a plurality of different scaling ratios such that portions of the floorplan layout are concurrently scaled with the plurality of different scaling ratios and solving a constrained optimization problem to obtain a scaled output, placing cells at locations defined by the floorplan layout, and shape-constraint-based legalizing the floorplan layout using all of the constraints to produce a migrated layout.

A method for migrating circuit layouts according to one exemplary embodiment is shown that includes building a floorplan layout for a target circuit, using a subset of constraints that characterize a layout structure of an original circuit, said floorplan layout being represented by a hierarchy graph that comprises nodes that represent regions of the floorplan layout and children nodes that represent sub-regions of the floorplan layout within said regions, shape-constraint-based scaling the floorplan layout, by scaling parts of the floorplan layout in accordance with a plurality of different scaling ratios such that portions of the floorplan layout are concurrently scaled with the plurality of different scaling ratios, placing cells at locations defined by the floorplan layout, and shape-constraint-based legalizing the floorplan layout using all of the constraints to produce a migrated layout. Shape-constraint-based scaling includes building variables to represent shapes and instances in the floorplan layout, building constraints to represent a minimum set of design rules to represent the floorplan layout, scaling the floorplan layout according to a plurality of scaling ratios related to types of cell in the floorplan layout, and solving a constrained optimization problem to obtain a scaled output.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
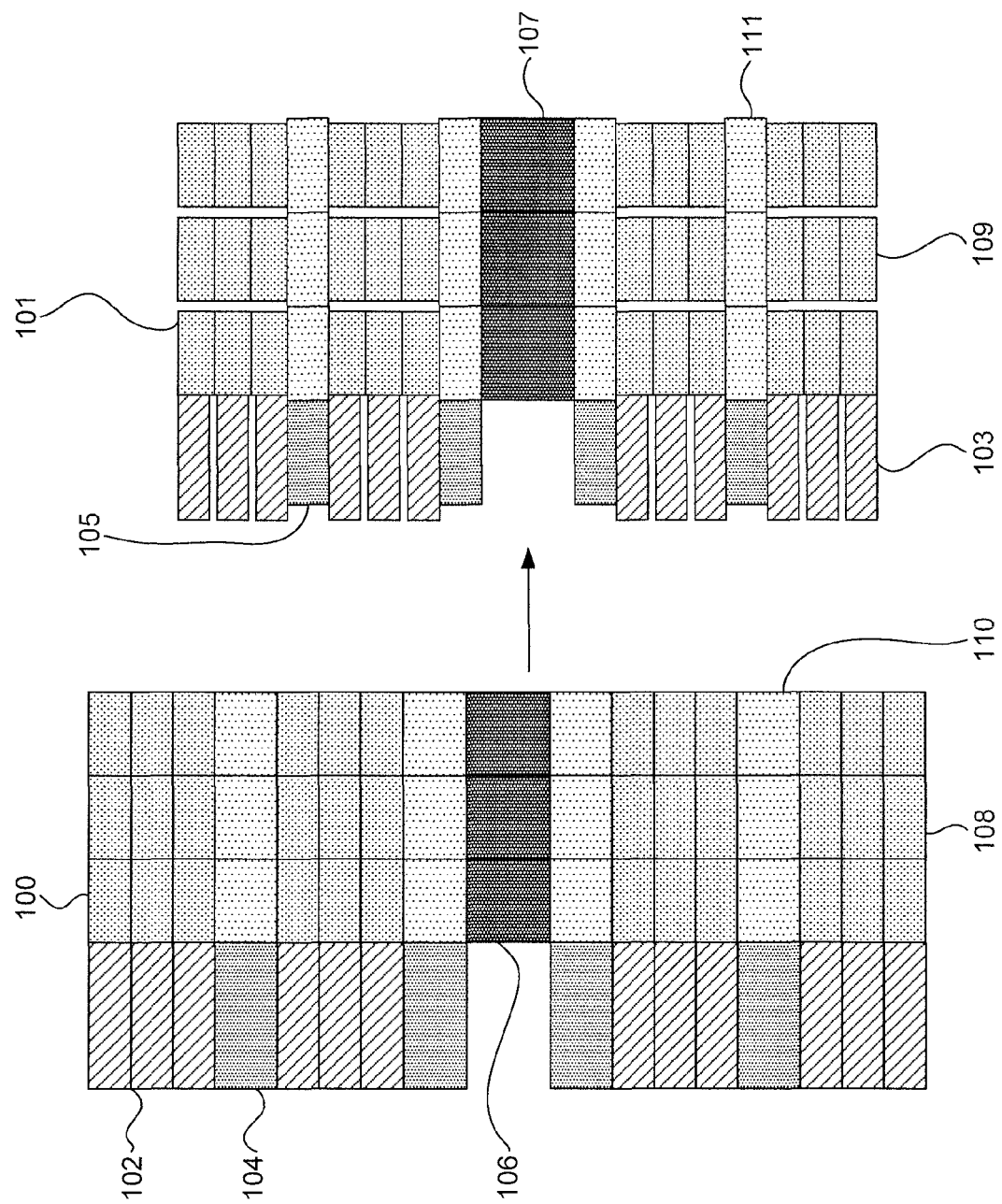
FIG. 1 is a diagram of an exemplary circuit layout before and after technology migration.

As fabrication techniques develop and change, integrated circuit (IC) layouts are adapted to take advantage of new technologies. Such a new technology may include a new fabrication process that allows etching at a smaller scale across the entire layout, or the technology may include an improved design for a particular component that allows for a reduction in size, while other components remain the same or are reduced but to a lesser degree. As a result of migrating a layout to such a technology, differing units and macros in a hierarchical layout may scale by different amounts. Such differential scaling poses a challenge for automating the migration process.

Automatic IC layout migration according to the present principles may be employed to quickly modify a layout from one technology to another technology in order to improve design productivity. The present principles may also be employed for circuit performance tuning and design for manufacturing. For example, a symbolic layout can be shrunk to minimize the total area of a circuit design, a crude layout can be legalized to meet a set of design ground rules, critical nets can be spaced farther apart to reduce coupling noise, device sizes can be changed to improve circuit performance, wires of a layout can be spread apart to make use of white space to improve the random defect yield, and critical features can be modified to remove lithography hot spots. In modern very large scale integration (VLSI) designs, layout migration is becoming more important as layouts and design ground rules become more complicated.

There are substantial challenges, however, in automating the design of structural layouts such as array macros. For example, in a static random access memory (SRAM) array, SRAM bit cells do not bear the same scaling ratio as a pitch-match circuit, gaps need to be inserted between cells to meet inter-cell pitch-match and maintain wire connectivity at the same time, and design rules may not be migratable, such that part of the layout may need to grow during technology migration.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Referring now to the drawings in which like numerals represent the same or similar elements and initially to FIG. 1, an exemplary migration is shown for a simple array macro 100. The array macro 100 is intended to resemble an SRAM array, but the present principles are applicable to any circuit layout. The array macro includes a set of bit cells 108, local evaluation circuits 110, input/output (IO) bit decoder blocks 106, with word decoders 102 and word decoder controllers 104. By the present principles, the array macro 100 is migrated to a new technology, producing migrated array 101. The newly migrated array 101 includes migrated bit cells 109, migrated local eval circuits 111, migrated I/O bit decoder blocks 107, and migrated components 103 and 105 of the word decoders. By migrating to the new technology, each individual component shrinks by a characteristic amount, but this amount is not always in proportion to the other components. Thus, components which touched each other in the array macro 100 may be separated by some distance in the migrated macro 101, or may be shifted relative to one another in order to preserve functional relationships.

Previously existing migration methods cannot meet the requirements of modern technology migration. For example, traditional symbolic layout to physical layout translation takes the form of compaction, but these methods apply to flat layouts only and do not discuss challenges such as pitch match, differential hierarchical scaling, and so on. To preserve the hierarchy, the present principles employ hierarchical layout optimization. Such optimization may be formulated as a linear programming problem. However, a significant consideration in layout modification is that the resulting shape edge and cell location should be integers, such that the edges and cells align to a design grid. This is imposed by the structures of an industrial layout database and manufacturing considerations. The step of the grid may vary depending on the design. For the purpose of illustration, an exemplary grid size of 1 nm may be used herein.

This gives rise to integer linear programming (ILP) problems when attempting to use optimization techniques on hierarchical layouts. Previous techniques have focused on the hierarchical compaction problems which are solved as an ILP problem using general purpose ILP solvers, but could not accommodate for differential scaling in pitch-matching and aspect ratios while maintaining functional connectivity. Furthermore, the prior art does not handle well with the case where part of a layout needs to grow. The present principles use floorplan-based migration to accommodate differential scaling ratios, pitch matching, and the uneven growth of different parts of circuit layouts.

Figure 2:
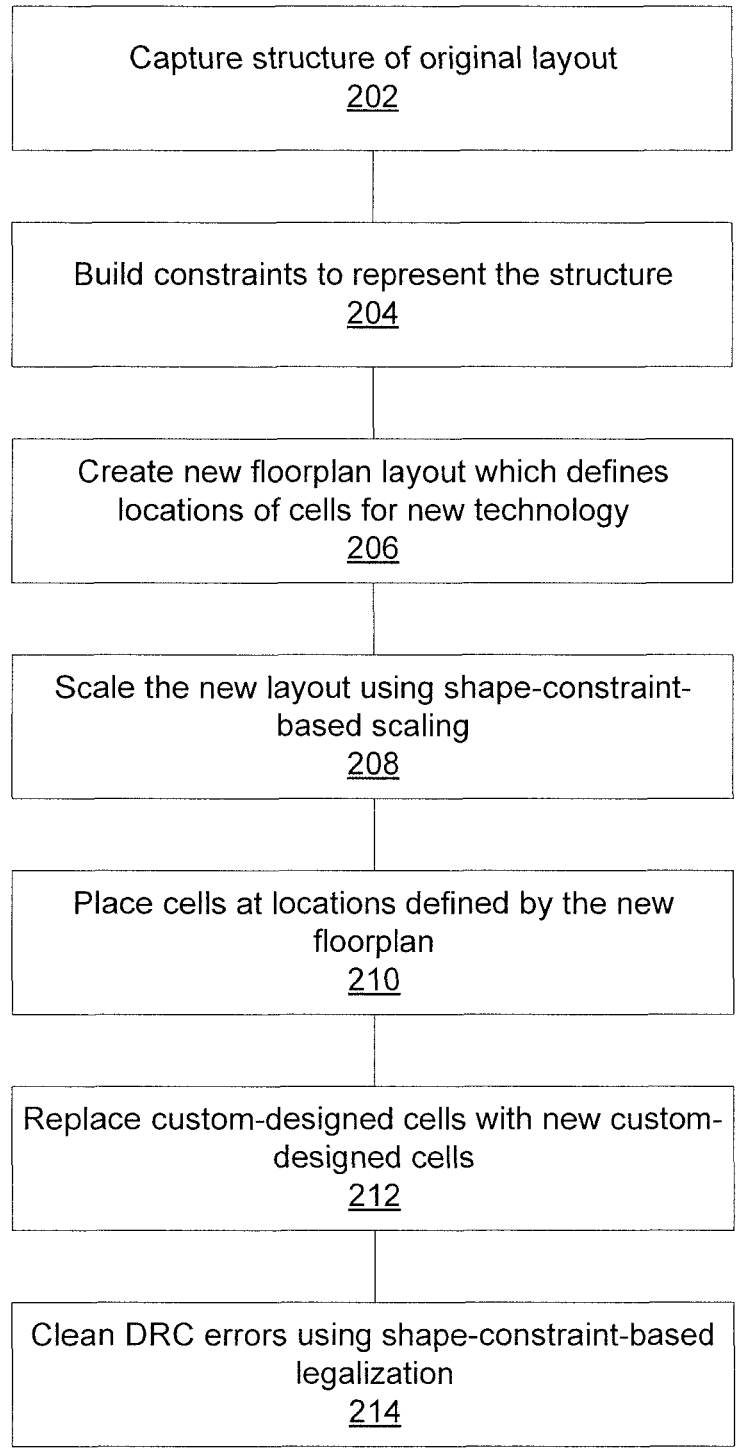
FIG. 2 is a block/flow diagram of structural circuit layout migration in accordance with one illustrative embodiment.

Referring now to FIG. 2, a method for floorplan-based migration is shown. In block 202, an original layout is provided (e.g., an array macro 101) in a first technology and block 202 captures the structure of that original layout. Block 204 then represents that structure using constraints that describe the relationships between elements of the structure with pitch matching and wire connectivity. Block 208 generates a new floorplan layout which defines locations of cells in a second technology and accommodates differential scaling ratios and uneven growing between different components.

Block 208 scales the new layout floorplan layout according to the shape constraints found in block 204. This preserves functional relationships between components that would otherwise be lost by a naïve scaling. Block 210 then places cells at the locations defined by the new floorplan. If there were custom-designed cells present in the original layout, block 212 replaces these with new custom-designed cells, designed to accommodate the new technology. Block 214 then cleans design rule checking (DRC) errors using shape-constraint-based legalization. Legalization 214 ensures that all (or most) of the pertinent design rules (e.g., rules mandating size, spacing, and enclosure for components and cells) are met so that the layout produced is valid. Block 214 produces a final layout (e.g., migrated macro 101) that takes advantage of the new technology while maintaining structural and functional relationships.

An exemplary hierarchical circuit layout, for example macro array 100, is organized hierarchically as a set of cells (e.g., 102, 104, 106, etc.) each containing polygon shapes and nested transformations (or instances) of other cells. A cell is defined once and can be instantiated or referenced as a transformation in the layout 100 many times. When a cell is referenced, the absolute coordinates of the shapes defined in the cell are computed by applying a reference transformation. For example, a cell C may be instantiated by a transformation $T=(t(x),t(y),a,m)$ represented by a 4-tuple, where m is 1 if the cell is mirrored along the x-axis and 0 otherwise, a is an angle to rotate the cell, and $t(x)$ and $t(y)$ are reference locations in the x- and y-axes respectively.

The flat coordinate $(x,y)$ of a point $(e(x),e(y))$ in a cell C (in other words, the coordinate of the point $(e(x),e(y))$ in the parent cell) may be given by $$(x,y)=T \otimes (e(x),e(y))=(t(x),t(y),a,m) \otimes (e(x),e(y)),$$

which can be written as:

$$x=t(x)+e(x)\cos(a)-(1-2m)e(y)\sin(a)$$

$$y=t(y)+e(x)\sin(a)+(1-2m)e(y)\cos(a).$$

A cell C may also be instantiated by a step-and-repeat transformation represented by an 8-tuple $T=(t(x),t(y),a,m,h,v,\delta(x),\delta(y))$, where h and v describe that the instantiation repeats h and v times in the x- and y-axes respectively such that it forms an h-by-v array (such as cells 108 in FIG. 1) and $\delta(x)$ and $\delta(y)$ describe the step (or pitch) of the step-and-repeat array in the x- and y-axes respectively.

The flat coordinate $(x_{i,j},y_{i,j})$ of a point $(e(x),e(y))$ in the $(i,j)^{th}$ instance can be written as:

$$x=t(x)+i \cdot \delta_x+e(x)\cos(a)-(1-2m)e(y)\sin(a)$$

$$y=t(y)+j \cdot \delta_y+e(x)\sin(a)+(1-2m)e(y)\cos(a).$$

Without loss of generality, a step-and-repeat transformation $T=(t(x), t(y),a,m,h,v,\delta(x),\delta(y))$ can be simplified and represented by h×v transformations $\{(t(x)+i\cdot\delta(x),t(y)+j\cdot\delta(y),a,m) | 0 \leq i < h, = \leq j < v\}$.

The hierarchical circuit layout shown in FIG. 1 represents a simple SRAM array and has a root cell representing the whole hierarchical layout. In other words, the root cell represents an SRAM array by way of its child cells. The overall hierarchy structure in a hierarchical layout may also be represented as a hierarchy graph. Such a hierarchy graph is rooted, directed, and acyclic, with arcs corresponding to transforms and nodes corresponding to cells.

Figure 3:
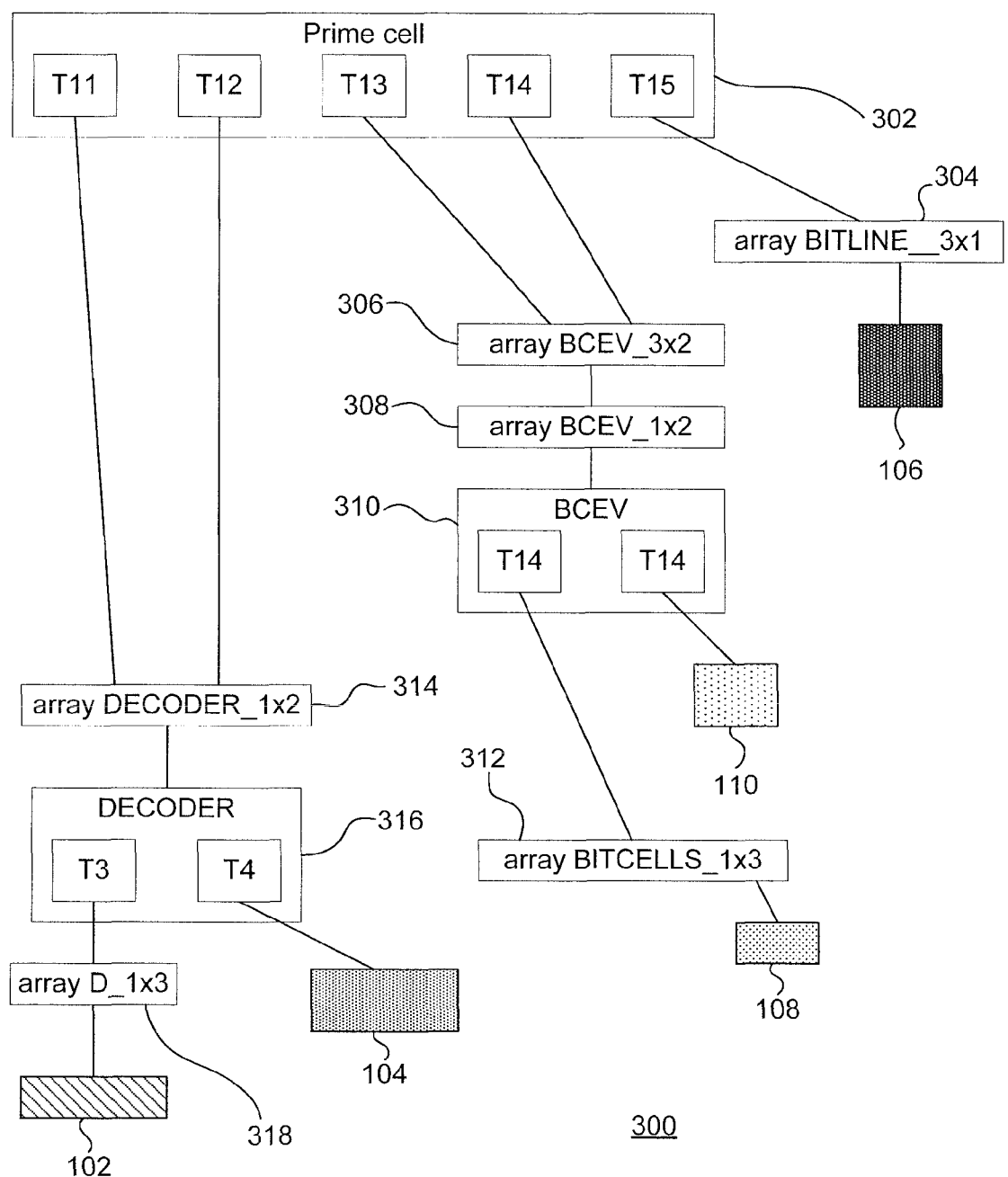
FIG. 3 is an exemplary hierarchical layout graph corresponding to the exemplary circuit layout of FIG. 1 in accordance with one illustrative embodiment.

Referring now to FIG. 3, a hierarchy graph 300 of the hierarchical circuit layout of FIG. 1 is shown. The prime element, block 302, defines positions for five components in the array macro 100 of FIG. 1, each representing an 8-tuple $T=(t(x),t(y),a,m,h,v,\delta(x),\delta(y))$ as discussed above. For example, bitline 304 may be denoted as T10=(t10(x),t10(y), 0,0,3,1,δ10(x),n/a). For ease of description, each of the components of the prime element 302 corresponds directly to one child node, denoted by an emanating line. Elements having multiple sub-units, such as prime unit 302 have those units shown but not explicitly numbered—it should be understood that the sub-units of a given node directly correspond to the child node. For example, prime cell 302 includes two decoder arrays 314, T11 and T12, each of which includes one decoder 316.

The macro 100 includes one bitline array 304, two bit cell eval (BCEV) arrays 306, and two word decoder arrays 314. An arc connects the prime 302 block to each of the respective elements, with each arc representing one instance of the child cell within the parent cell. The 8-tuple syntax describes positions with x and y coordinates in parentheses, each numbered x or y representing the position of the element in the layout 100. An array element, such as bitline array 304, defines the dimensions of the array and includes a corresponding arrangement of its child nodes. In the case of bitline array 304, there are three bitline elements 106 arranged horizontally at a defined (x,y) position.

Also shown are the two BCEV arrays 306. Each BCEV array is defined as repeating three times horizontally and twice vertically. Block 308 zooms further in, providing a further horizontal repetition of the basic BCEV component, defined in block 310. Each BCEV element is comprised of two parts: an array 312 of bitcells 108 and an evaluator 110. The prime 302 also includes two decoder arrays 314, each repeated vertically. Each decoder 316 comprises two elements: an array 318 of blocks 102 and one block 104. The hierarchy may continue, subdividing the blocks 102-110 into yet smaller components. In this fashion, the entire macro 100 is defined hierarchically, branching down from the PRIME root node 302 to ever-greater levels of detail.

In a hierarchical circuit layout graph 300, the design ground rule constraint is specified between a pair of flat edges. For example, between two adjacent bit cells in layout 100, a constraint may be that vertically adjacent edges are to remain adjacent, whereas horizontally adjacent edges may separate. Let $\epsilon_i$ represent the flat edge for an edge $e_i$ with instance path $T_{i_n} \otimes T_{i_{n-1}}, \ldots \otimes T_{i_1}$. Then the constraint in the x-direction can be represented by a formula of the form:

$$\epsilon_j(x, T_{j_m} \otimes |T_{j_{m-1}} \ldots \otimes T_{j_1}) - \epsilon_i(x, T_{j_n} \otimes |T_{j_{n-1}} \ldots \otimes T_{j_1}) \geq d_{ij}.$$

Although discussion herein only addresses four orientations of a cell (normal orientation, mirrored orientation about the x-axis, mirrored orientation about the y-axis, and rotational orientation) restricted by the design rules, this is not intended to be limiting. However, a formulation according to these four orientations can be made without loss of generality, resulting in the equivalent form:

$$(t_{j_m}(x) \pm t_{j_{m-1}}(x) \ldots \pm t_{j_1} \pm e_j(x)) - (t_{i_n}(x) \pm t_{i_{n-1}}(x) \ldots \pm t_{i_1} \pm e_i(x)) \geq d_{ij}.$$

Each of the t(x) functions represents a reference location of the $i_n^{th}$ or $j_n^{th}$ element along the x-axis, with the i and j subscripts enumerating the edges.

Figure 4:
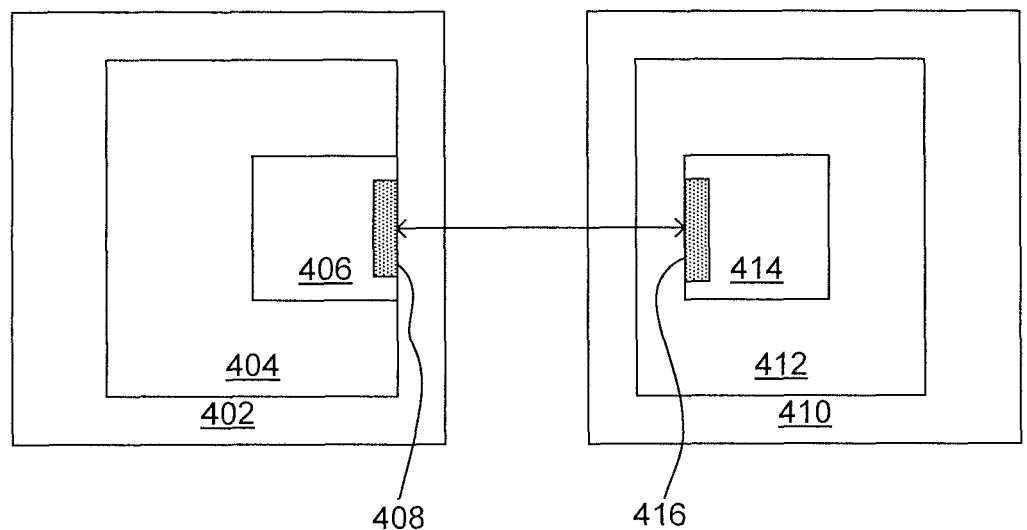
FIG. 4 is a diagram of a hierarchical constraint between two exemplary shape edges.

Referring now to FIG. 4, a diagram of a hierarchical constraint between two shape edges is shown. Two neighboring hierarchical layouts are shown that include elements 402-408 and 410-416 respectively. The edges 408 and 406 represent edges $e_i$ and $e_j$ respectively, while 402-406 and 410-416 represent $t_i$ and $t_j$ respectively. The constraint asserts that the distance between edges 408 and 416 will be greater than or equal to $d_{ij}$. It is not always advantageous to minimize structure size. For example, if the separation between two wires falls below a certain threshold, this may produce an electrical short circuit. Providing that the distance between edges will be greater than or equal to $d_{ij}$ establishes a minimum distance between edges 408 and 416.

Hierarchical circuit layout migration may be performed in two successive steps, migrating each of the orthogonal x and y dimensions of the layout separately. Although it is possible to perform a two-dimensional legalization, successive migrations can meet most of the ground rule constraints in a realistic layout migration environment and are capable of producing good results in practice with a much shorter run time. When two-dimensional constraints do occur, they may be decomposed into one-dimensional constraints and legalized by an iterative one-dimensional optimization. For that reason, the discussion herein focuses on a one-dimensional migration along the x dimension, but it should be recognized that this is for the sake of illustration only and is not intended to be limiting. For the sake of simplicity, formulas are expressed hereafter using e to represent the edge location e(x) and t is used to represent the cell location t(x).

The migration problem with minimum layout perturbation is formulated as follows:

$$\min\left(\sum_i w_i |t_i - t_i^{old}| + \sum_j w_j |e_j - e_j^{old}|\right), \quad (1)$$

subject to:

$$(t_{j_m} \pm t_{j_{m-1}} \ldots \pm t_{j_1} \pm e_j) - (t_{i_n} \pm t_{i_{n-1}} \ldots \pm t_{i_1} \pm e_i) \geq d_{ij},$$

where $t_i$ represents the transformation variable, $t_i^{old}$ is the original value of $t_i$ in the input layout, $e_j$ represents the edge variable, $e_j^{old}$ is the original value of $e_j$ in the original layout, and $w_i$ and $w_j$ are the weights for the layout perturbation cost of the transformation location and the edge location respectively. The absolute value objective is a special case of a convex piecewise linear objective, which can be linearized. This establishes the optimization of formula (1) as a linear programming problem.

The compaction problem of minimizing the layout area during the migration may be expressed as:

$$\min(x_{max}) \quad (2)$$

Subject to:

$$(t_{j_m} \pm t_{j_{m-1}} \ldots \pm t_{j_1} \pm e_j) - (t_{i_n} \pm t_{i_{n-1}} \ldots \pm t_{i_1} \pm e_i) \geq d_{ij}.$$

Although the above problem formulations can theoretically be solved by an ILP solver, structural layout migration for realistic circuits may include pitch matching circuits, uneven scaling ratios, and the possibility that some parts will need to grow unevenly due to an unmigratable design rule. As a result, there exist potential conflicts among the constraints and an ILP solver will have difficulty finding a feasible solution. Therefore the present principles incorporate floorplan migration, which first captures 202 the overall structure of the structural layout and then generates in block 206 a target floorplan of structure which satisfies the pitch matching or requirement and accommodates the differential scaling and uneven growth. The floorplan migration should also be flexible enough to incorporate user-defined constraints.

Floorplan migration works on a list of cells of interest. Such a list may be a cross cut of a hierarchy graph, such as that shown in FIG. 3. A cell of interest can be, for example, a predefined library cell (such as a latch or a logical gate) or a logical unit defined by the user (such as a bit cell, a bit decoder, or some other sub-circuit with a well-defined functionality). The abstract of a cell of interest is represented by a representative box in the hierarchy graph with an input/output interface, for example bitline array 304. In this way the structure of the original floorplan, such as the array macro 100, may be automatically extracted with a list of cells of interest.

Constraints may be built 204 with a scan line search to represent the structure of the floorplan including pitch matching and wire connectivity. The structure of the original floorplan can be expressed by a set of weighted linear inequality constraints. For example, an abutment constraint forces cells to remain touching after migration and may be expressed as an equality, e.g., x3+x6+x14=x9+x13+x19+x18. A relative position constraint maintains the relative order of cells in the layout, such that mutually visible cells remain mutually visible. For example, a constraint of x13>=x2 requires that the cell 13 will always occur to the right of the cell 2. A pitch matching prevents uneven scaling in pitch-matching circuit cells. For example, as the cells 102 and 108 are scaled smaller in FIG. 1, the cells 102 shrink more than the cells 108. A pitch matching constraint, e.g., y8=y5, maintains the pitch-matched relationship between these cells through scaling. A wire constraint, expressed as a set of inequality constraints, ensures that, if two cells are connected by a straight wire, a straight wire may still be placed over the scaled cells in the migrated design. A hard size constraint may also be used to fix the size of a target cell in the new technology. An example of such a constraint might be x0=12.

Figure 5:
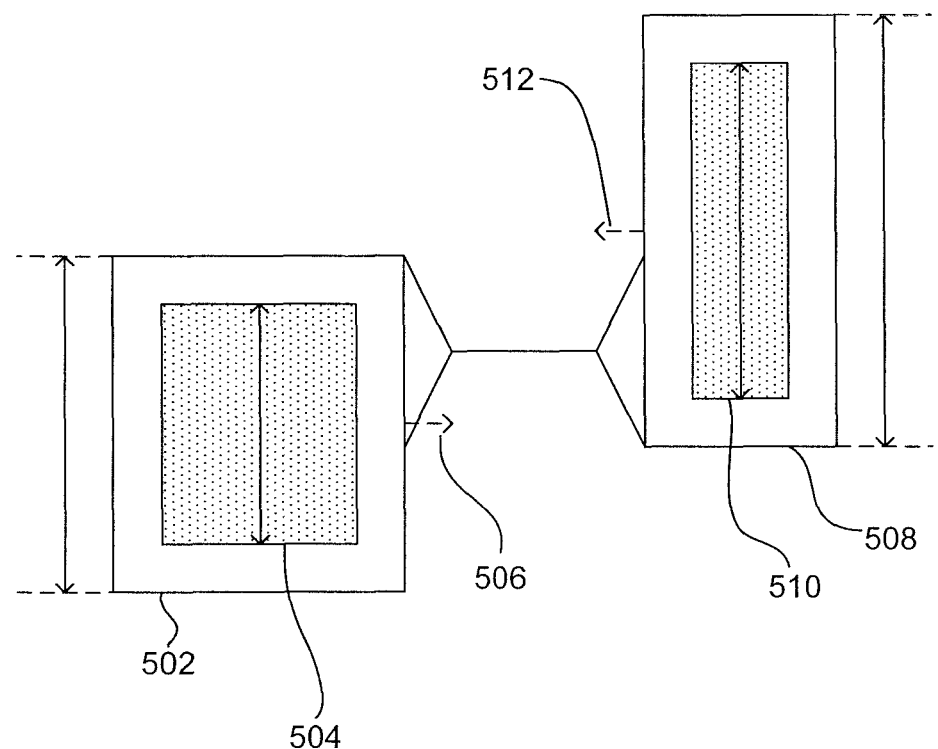
FIG. 5 is a diagram of an exemplary alignment constraint between two circuit structures.

Referring now to FIG. 5, an alignment constraint is illustrated. An alignment constraint may be a soft constraint that preserves common proportions for a pair of mutually visible cells. As two cells 502 and 508 are scaled to smaller equivalent cells 504 and 510, their alignment relationship is to be preserved. Each cell has a center reference, 506 and 512 respectively, which is denoted as c1 and c2 respectively. In case the scaling of the cells results in a change in cell centers, the new cell centers are referred to as c1' and c2'. Each cell has an original length and a target length, denoted as l1 and l2 for the original cells and l1' and l2' for the scaled cells. The alignment constraint may then be formulated as:

$$\left| (c1' - c2') - (c1 - c2)\frac{l1' + l2'}{l1 + l2} \right| \to 0.$$

It is often advantageous to introduce principal design changes to the structure of the migrated floorplan 101 that are not inherited from the original floorplan. These may be represented as user-defined constraints. All constraints are stored in an intermediate format, to which user-defined constraints may be added. After all constraints are captured in block 204, a user may be provided the option to add any number of additional constraints through a graphical user interface. For example, the user may force a minimum distance between two parts of the design or force a vertical or horizontal alignment of certain cells. User-defined constraints may have a high priority, such that they override automatically generated constraints.

Figure 7:
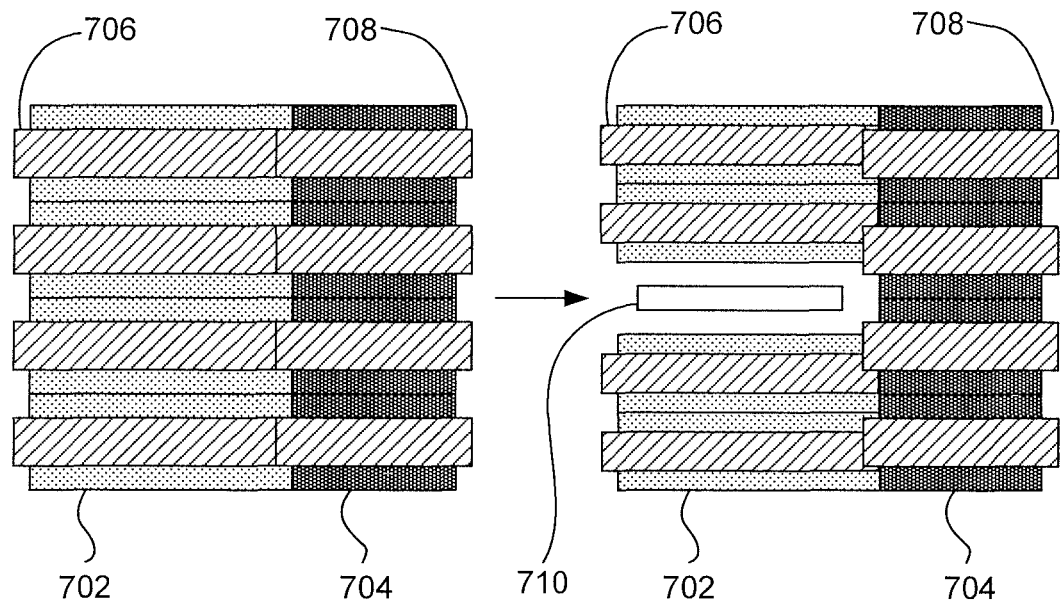
FIG. 7 is a diagram of an exemplary user constraint in technology migration.

Referring now to FIG. 7, an example of a user constraint is shown. Due to differential scaling, cells 702 shrink more than cells 704. If allowed to shrink together, the bottommost wire 706 would break from its counterpart 708, destroying the connectivity between the respective cells. As such, a user may enter a constraint, for example, with placeholder 710. Placeholder 710 keeps the stack of cells 702 and the stack of cells 704 at the same height. The wires 706 and 708 are not perfectly aligned afterward, but connection is maintained.

After all of the constraints have been formulated, a new floorplan can be generated in block 206 by solving the linear programming problem defined by said constraints. The new floorplan, e.g., migrated array 101, gives locations of the instances for the list of cells of interest. These locations are actually the values of the transformation variables in the layout migration problem described above. What remains is to find the solution for the remaining transformation variables and edge variables. In realistic migrations, this problem may be difficult to solve directly if all design rules are considered at once. For example, the width of the geometries may influence the spacing value between geometries and the via coverage value, the end-to-end spacing and end-to-side spacing may need different values, and so on. This may therefore be addressed by a two-step approach: shape-constraint-based scaling 208 and shape-constraint-based legalization 214.

Shape-constraint-based scaling 208 considers a minimum set of design rules to ensure that transistor device size and wire connectivity are maintained correctly. For example, the metal spacing rules include a design rule to describe the minimum spacing between metals via coverage rules include a design rule to describe minimum coverage value by metal, and so on. The full set of design rules is considered in the later stage of shape-constraint-based legalization 208.

Figure 6:
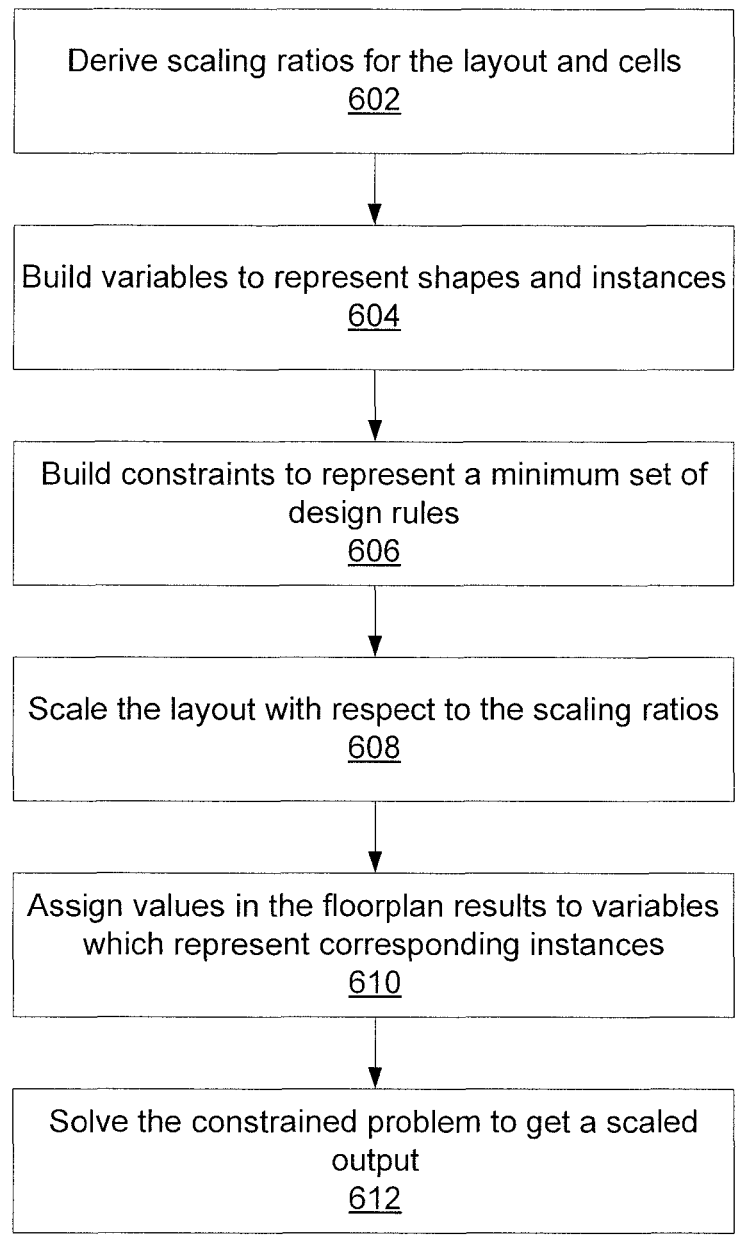
FIG. 6 is a block/flow diagram of shape-constraint-based scaling in accordance with one illustrative embodiment.

Referring now to FIG. 6, a block/flow diagram of shape-constraint-based scaling is shown. Block 602 derives scaling ratios for the whole layout. Block 604 builds variables to represent the shapes and the instances of cells, and block 606 builds constraints that represent a minimum set of design rules. Block 608 scales the layout with respect to the scaling ratios derived in block 602, where the scaled values serve as $t_i^{old}$ and $e_i^{old}$ in formula (I) above. Block 610 assigns values in the floorplanning results to the variables which represent corresponding instances of cells. Block 612 then solves the constrained problem represented by formula (I) to arrive at a scaled layout.

Block 212 of FIG. 2 describes replacing custom-designed cells with new custom-designed cells. Some cells, such as library cells and SRAM bit cells, may be custom-designed within a given technology. These cells in the scaled layout will be replaced with new cells geared toward the new technology. During the floorplan migration of block 206, the to-be-replaced cells are assigned with a target size which matches with their target size in the new technology. This allows the floorplan migration 206 to place instances of these cells at the proper locations. In the shape-constraint-based scaling 208, these cells are scaled with a scaling ratio that matches their target size. In this way, the replacement of custom-designed cells is kept from disrupting the migration process.

Block 214 takes into account the full set of design rules for shape-constraint-based legalization. This includes building variables to represent shapes and the instances of cells and building constraints to represent the full set of design rules. The constrained linear programming problem may then be solved to generate a legalized layout. Since the full set of design rules and grid constraints are considered, this step may include several iterations (referred to herein as a "sub-step) to obtain a higher quality result. A subset of design rules may be considered in a sub-step and the union of the design rules of all sub-steps covers the full set of design rules. Legalization is independent of the rest of the migration process and is always performed last.

Figure 9:
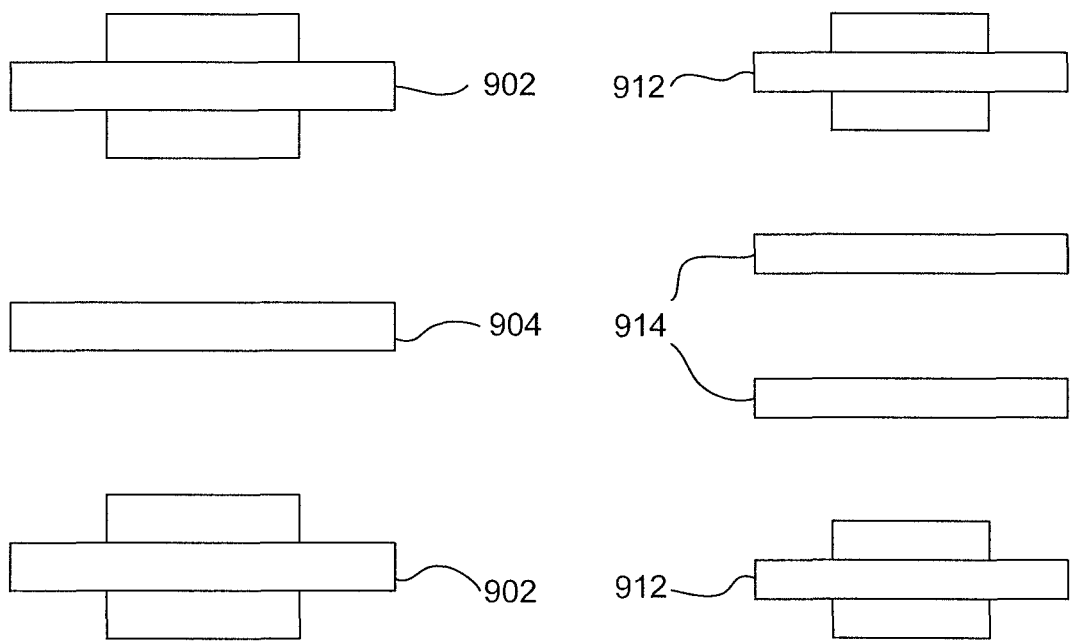
FIG. 9 is a diagram of an exemplary unmigratable design rule.

Referring now to FIG. 9, the case of an unmigratable rule is shown. For example, according to some lithographic manufacturing requirements, it may be that two transistors 902 must be spaced apart by dummy structures 904 with a given narrow range of width (e.g., between 35 nm and 45 nm) and a given pitch (e.g., 40 nm). When migrating to a new technology in a new layout, the space between transistors will scale with the rest of the layout. However, to satisfy the unmigratable manufacturing rule regarding the spacing between the migrated transistors 912, additional pitches 914 are introduced. In this way, the layout can grow to accommodate unmigratable rules.

Table 1 below shows the results of migrating five array macros. These numbers reflect experiments conducted on a 2.5 GHz computer with 16 GB of memory and are intended to show the enormous complexity and of the task of migration, and the advantage of the present principles in automating such migration. The runtime of floorplan migration 206, shape-constraint-based scaling 208, cell placement 210, and shape-constraint-based legalization 214 described with respect to FIG. 2 are shown in minutes. As can be seen from the table, each test array has a very high number of variables and constraints to accommodate,

TABLE 1

|  |  |  | Runtime (minutes) | | | |
| --- | --- | --- | --- | --- | --- | --- |
| Test case | # of variables | # of constraints | Block 206 | Block 208 | Block 210 | Block 214 |
| Array 1 | 582442 | 1053399 | 1 | 2 | <1 | 33 |
| Array 2 | 447186 | 1058064 | 1 | 3 | <1 | 53 |
| Array 3 | 69289 | 151383 | 1 | 3 | <1 | 14 |
| Array 4 | 286058 | 749440 | 1 | 3 | <1 | 54 |
| Array 5 | 897819 | 1643553 | 1 | 3 | <1 | 96 |

Cell placement 210 is straightforward and can be done quickly, in the above cases in a few seconds, whereas shape-constraint-based legalization takes the majority of the runtime. Floorplan migration 206 works on an abstract of a list of cells of interest, so that the number of variables and constraints used to model the problem is reduced. Shape-constraint-based scaling 208 includes only the minimum set of design rules needed to ensure critical device features (e.g., poly placing over a diffusion) and wire connectivity. Shape-constraint-based legalization 214, however, uses the full set of design rules and grid constraints. Legalization 214 may further include sub-steps to resolve conflicts among the design rules and the grid constraints to produce better results. In contrast, solving these migration problems using existing approaches produced substantial overlap in the placement of circuit cells due to differential scaling in pitch-matching and uneven growth, which makes the migrated placement unusable. Compared to custom design methodologies, where a design is divided into pieces and the pieces are custom-placed and routed to form an array macro, the present principles can save as much as two thirds of designers' efforts.

Figure 8:
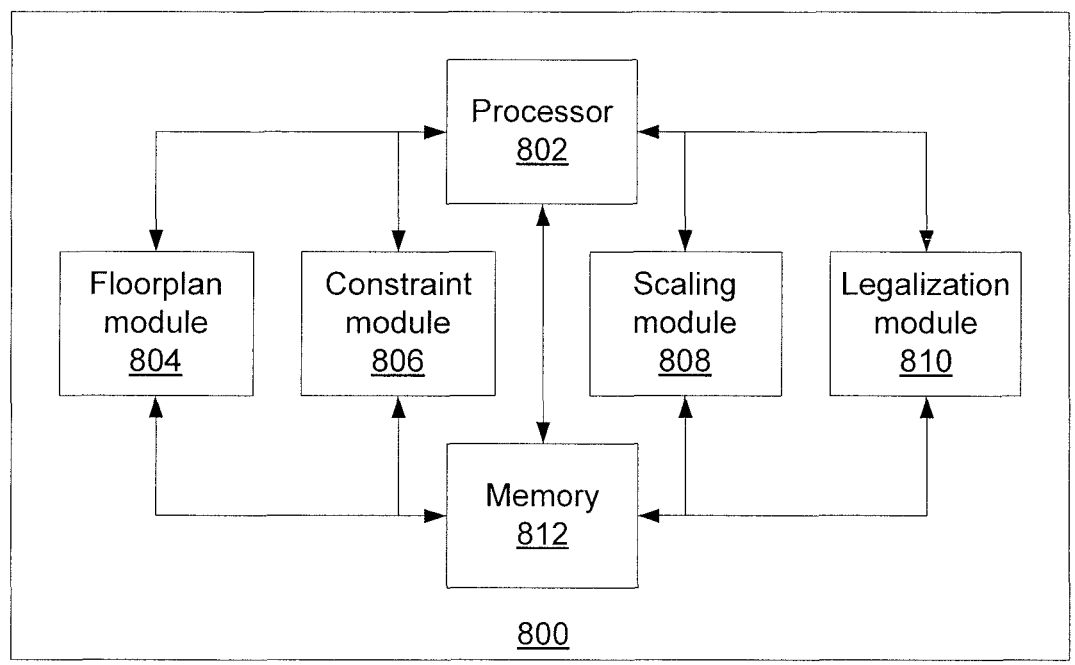
FIG. 8 is a schematic diagram of a system for performing structural circuit layout migration in accordance with one illustrative embodiment.

Referring now to FIG. 8, a system 800 for performing structural circuit layout migration is shown. A processor 802 in communication with memory 812 works with a constraint module 806 to build constraints that represent an original layout. Floorplan module 804 generates a floorplan for a target circuit using a subset of the constraints. A scaling module 208 uses shape-constraint-based scaling to scale the floorplan to reflect the use of a new technology. Legalization module 810 uses all of the constraints to perform shape-constraint-based legalization of the layout. The legalization module 810 produces as output a migrated circuit layout. Any or all of modules 804-810 may use or include processor 802 in performing their respective tasks.

Having described preferred embodiments of a system and method for structural migration of integrated circuit layouts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for migrating circuit layouts comprising:
building a floorplan layout for a target circuit using a subset of constraints that characterize a layout structure of an original circuit, wherein at least one of said constraints represents a relationship between more than two cells;
shape-constraint-based scaling the floorplan layout by scaling parts of the floorplan layout in accordance with a plurality of different scaling ratios such that portions of the floorplan layout are concurrently scaled with the plurality of different scaling ratios;
placing cells at locations defined by the floorplan layout; and
shape-constraint-based legalizing the floorplan layout using all of the constraints to produce a migrated layout.

2. The method of claim 1, further comprising growing a portion of the floorplan layout to accommodate an unmigratable design rule.

3. The method of claim 2, wherein growing a portion of the floorplan layout includes introducing a dummy structure.

4. The method of claim 1, further comprising determining whether custom-designed cells exist in the original circuit.

5. The method of claim 4, further comprising replacing custom-designed cells with custom-designed cells for the target circuit.

6. The method of claim 1, wherein the constraints include one or more user-defined constraints.

7. The method of claim 6, wherein said user-defined constraint includes the introduction of a place-holder.

8. The method of claim 1, wherein shape-constraint-based scaling comprises:
building variables to represent shapes and instances in the floorplan layout;
building constraints to represent a minimum set of design rules to represent the floorplan layout;

scaling the floorplan layout according to a plurality of scaling ratios related to types of cell in the floorplan layout; and solving a constrained optimization problem to obtain a scaled output.

9. The method of claim 8, wherein the constraint optimization problem includes:

$$\min\left(\sum_i w_i|t_i - t_i^{old}| + \sum_j w_j|e_j - e_j^{old}|\right),$$

subject to $$(t_{j_m} \pm t_{j_{m-1}} \ldots \pm t_{j_1} \pm e_j) - (t_{i_n} \pm t_{i_{n-1}} \ldots \pm t_{i_1} \pm e_i) \geq d_{ij},$$

where $t_i$ represents a transformation variable, $t_i^{old}$ is an original value of $t_i$ in the layout structure of the original circuit, $e_j$ represents an edge variable, $e_j^{old}$ is an original value of $e_j$ in the layout structure of an original circuit, $w_i$ and $w_j$ are weights for a layout perturbation cost of a transformation location and an edge location respectively, and $d_{ij}$ represents a minimum distance.

10. The method of claim 1, wherein the floorplan layout is represented as a hierarchy graph.

11. The method of claim 10, wherein the hierarchy graph comprises nodes that represent regions of the floorplan layout and children nodes that represent sub-regions of the floorplan layout within said regions.

12. The method of claim 10, wherein hierarchy graph includes nodes that represent arrays of subnodes.

13. A computer readable storage medium comprising a computer readable program, wherein the computer readable program when executed on a computer causes the computer to perform the steps of:

building a floorplan layout for a target circuit using a subset of constraints that characterize a layout structure of an original circuit, where at least one of said constraints represents a relationship between more than two cells;

shape-constraint-based scaling the floorplan layout by scaling parts of the floorplan layout in accordance with a plurality of different scaling ratios such that portions of the floorplan layout are concurrently scaled with the plurality of different scaling ratios;

placing cells at locations defined by the floorplan layout; and shape-constraint-based legalizing the floorplan layout using all of the constraints to produce a migrated layout.

14. A system for migrating circuit layouts comprising:

a constraints module configured to establish constraints to characterize a layout structure of an original circuit, where at least one of said constraints represents a relationship between more than two cells;

a floorplan module configured to build a floorplan layout for a target circuit using a subset of said constraints;

a scaling module including a processor configured to perform shape-constraint-based scaling on the floorplan layout by scaling parts of the floorplan layout in accordance with a plurality of different scaling ratios such that portions of the floorplan layout are concurrently scaled with the plurality of different scaling ratios; and a legalization module configured to perform shape-constraint-based legalization using all of the constraints and further configured to output a migrated layout.

15. The system of claim 14, wherein the floorplan module is further configured to determine whether custom-designed cells exist in the original circuit and, if so, is configured to replace said custom-designed cells with custom-designed cells for the target circuit.

16. The system of claim 14, wherein the constraints include one or more user-defined constraints.

17. The system of claim 16, wherein said one or more user-defined constraints include the introduction of a placeholder.

18. The system of claim 14, wherein the floorplan module is further configured to grow a portion of the floorplan layout to accommodate an unmigratable design rule.

19. The system of claim 14, wherein the floorplan module is further configured to introduce a dummy structure into the layout.

20. The system of claim 14, wherein the scaling module is further configured to build variables to represent shapes and instances in the floorplan layout, to build constraints to represent a minimum set of design rules to represent the floorplan layout, to scale the floorplan layout according to a plurality of scaling ratios related to types of cell in the floorplan layout, and to solve a constrained optimization problem to obtain a scaled output.

21. The system of claim 20, wherein the constraint optimization problem includes:

$$\min\left(\sum_i w_i|t_i - t_i^{old}| + \sum_j w_j|e_j - e_j^{old}|\right),$$

subject to $$(t_{j_m} \pm t_{j_{m-1}} \ldots \pm t_{j_1} \pm e_j) - (t_{i_n} \pm t_{i_{n-1}} \ldots \pm t_{i_1} \pm e_i) \geq d_{ij},$$

where $t_i$ represents a transformation variable, $t_i^{old}$ is an original value of $t_i$ in the layout structure of the original circuit, $e_j$ represents an edge variable, $e_j^{old}$ is an original value of $e_j$ in the layout structure of an original circuit, $w_i$ and $w_j$ are weights for a layout perturbation cost of a transformation location and an edge location respectively, and $d_{ij}$ represents a minimum distance.

22. The system of claim 14, wherein the floorplan layout is represented as a hierarchy graph.

23. The system of claim 22, wherein the hierarchy graph comprises nodes that represent regions of the floorplan layout and children nodes that represent sub-regions of the floorplan layout within said regions.

24. A method for migrating circuit layouts comprising:

building a hierarchical floorplan layout for a target circuit using a subset of constraints that characterize a layout structure of an original circuit, where at least one of said constraints represents a relationship between more than two cells;

shape-constraint-based scaling the floorplan layout by scaling parts of the floorplan layout in accordance with a plurality of different scaling ratios such that portions of the floorplan layout are concurrently scaled with the plurality of different scaling ratios and solving a constrained optimization problem to obtain a scaled output;

placing cells at locations defined by the floorplan layout; and shape-constraint-based legalizing the floorplan layout using all of the constraints to produce a migrated layout.

25. A method for migrating circuit layouts comprising:

building a floorplan layout for a target circuit, using a subset of constraints that characterize a layout structure of an original circuit, said floorplan layout being represented by a hierarchy graph that comprises nodes that represent regions of the floorplan layout and children nodes that represent sub-regions of the floorplan layout within said regions;

shape-constraint-based scaling the floorplan layout, by scaling parts of the floorplan layout in accordance with a plurality of different scaling ratios such that portions of the floorplan layout are concurrently scaled with the plurality of different scaling ratios, comprising:

building variables to represent shapes and instances in the floorplan layout;

building constraints to represent a minimum set of design rules to represent the floorplan layout;

scaling the floorplan layout according to a plurality of scaling ratios related to types of cell in the floorplan layout; and solving a constrained optimization problem to obtain a scaled output; placing cells at locations defined by the floorplan layout; and shape-constraint-based legalizing the floorplan layout using all of the constraints to produce a migrated layout.

* * * * *